United States Patent [19]
Ying

[11] Patent Number: 5,946,596
[45] Date of Patent: Aug. 31, 1999

[54] METHOD FOR PREVENTING POLYCIDE LINE DEFORMATION BY POLYCIDE HARDENING

[75] Inventor: Tse-Liang Ying, Hsin-Chu, Taiwan

[73] Assignee: Taiwan Semiconductor Manufacturing Co., Ltd., Hsin-Chu, Taiwan

[21] Appl. No.: 08/734,624

[22] Filed: Oct. 18, 1996

[51] Int. Cl.⁶ .................................................. H01L 21/44
[52] U.S. Cl. ..................... 438/660; 438/625; 438/630; 438/632; 438/646; 438/647
[58] Field of Search .................................. 438/625, 630, 438/632, 646, 647, 660

[56] References Cited

U.S. PATENT DOCUMENTS 5,084,412  1/1992  Nakasaki ................................ 438/565
5,731,225  3/1998  Yamamori ............................... 438/653

*Primary Examiner*—John F. Niebling
*Assistant Examiner*—John Murphy
*Attorney, Agent, or Firm*—Tung & Associates

[57] ABSTRACT

The present invention provides a method for preventing a polycide line situated between two dielectric layers from deformation during a reflow process for one of the dielectric layers by annealing the polycide line and thereby increasing its hardness prior to the reflow process being conducted. The annealing process can be carried out either before or after the polycide line is formed at an annealing temperature in the range between about 700° C. and about 1000° C. in a furnace or by a rapid thermal process.

22 Claims, 1 Drawing Sheet

METHOD FOR PREVENTING POLYCIDE LINE DEFORMATION BY POLYCIDE HARDENING

FIELD OF THE INVENTION

The present invention generally relates to a method for preventing a polycide line deposited on a dielectric layer from deformation during a reflow process for the dielectric layer and more particularly, relates to a method for preventing a polycide line formed on a dielectric layer from deformation during a dielectric reflow process by annealing the polycide line at a temperature that is sufficiently high so as to cause an increase in the hardness of the polycide material.

BACKGROUND OF THE INVENTION

In recently developed semiconductor technology, polysilicon material which has been used in transistor gates is also being used in interconnects. However, one drawback of the polysilicon material when used as a long distance conductor in a semiconductor device is its relatively high sheet resistance, i.e., at between 20 and 40 ohm/square in a doped form. The high sheet resistance can cause a significant delay in a polysilicon wire when used as a long distance conductor.

One solution to solve the high sheet resistance problem of doped polysilicon is to reduce the resistance by combining the polysilicon material with a refractory metal. It is a desirable approach since no extra mask work is required for the fabrication process. Silicides for such semiconductor applications can be formed by reacting a refractory or near noble metal with silicon. For instance, more commonly used silicides are titanium silicide ($TiSi_2$), cobalt silicide ($CoSi_2$), tungsten silicide ($WSi_2$), platinum silicide (PtSi), molybedenum silicide ($MoSi_2$), palladium silicide ($Pd_2Si$), and tantalum silicide ($TaSi_2$). The most commonly used silicides are tungsten silicide, tantalum silicide and molybedenum silicide. These suicides are refractory metal suicides and therefore are thermally stable and resistant to processing chemicals. A silicide, such as tantalum silicide, can be used alone as a gate material presenting a sheet resistance of 1~5 ohm/square. Silicides can also be used in a sandwich form with polysilicon which is then known as a polycide, a condensed name for polysilicon-silicide. A polycide gate can achieve a low sheet resistance of less than 10 ohm/square which, represents a significant improvement from that of polysilicon alone.

When a polycide gate or a polycide line is used on a semiconductor device, a silicide layer is first blanket deposited over a layer of polysilicon and then the composite layers are patterned together. Based on its desirable low sheet resistance, the polycide structure can be advantageously used for local routing over short distances in the form of a polycide line. It is particularly desirable when only one or two levels of metals are used in a circuit as interconnects, since polycide lines can help to reduce the device size significantly.

When a polycide line is used in a multi-layer interconnect environment such as in a structure for a dynamic random access memory (DRAM), a dielectric material must be used in between the layers for insulation. For instance, to insulate a first metal layer from a silicon substrate, a dielectric material is typically deposited, planarized, and then patterned to define openings for contacts to silicon and polysilicon. This type of insulating dielectric material deposited is commonly referred to as a poly-metal dielectric (PMD) material. It can also be referred to as an inter-layer dielectric (ILD) material. An ideal PMD material should satisfy several property requirements. For instance, it should be contamination-free, it should exhibit a dielectric constant that approaches unity, and it should have a sufficiently high field strength and etch selectivity to underlaying materials such as suicides, silicon and polysilicon. It should also have gap filling capability in sub-half micron devices, it should also have good adhesion to the substrate and the overlaying metal, and it should also be a good barrier to ionic contaminants. It is also desirable that a PMD material can be easily planarized to facilitate subsequent fabrication steps.

More commonly used dielectric materials for PMD are boro-phophosilicate glass (BPS G), boro-phospho-tetra-ethoxy-silicate (BPTEOS) glass, phosphosilicate glass (PSG) and undoped silicate glass (USG). For instance, a typical PMD layer consists of a thick film (between about 3,000 Å and about 15,000 Å) of BPSG or BPTEOS which can be densified and reflowed at a temperature between about 700~900° C., and preferably between about 750~850° C. The reflow process of the PMD layer is important since a reflowed doped glass conformably covers steps and fills gaps between polycide lines and forms a nearly planar surface which is essential for subsequent fabrication steps. During a reflow (or planarization) process of a PMD layer in a semiconductor structure which has more than one PMD layers, problem occurs when the top PMD layer is heated to a temperature above its glass transition temperature in order to enable the material to flow.

Referring initially to FIG. 1A, where a semiconductor device 10 is shown. In the semiconductor device 10, a bird's beak field oxide isolation 12 is first formed in the surface layer of a silicon substrate 14. A PMD layer 16 of either BPSG or BPTEOS material is then deposited on top of the substrate and the field oxide isolation. After a polycide line 18 formed of a polysilicon layer 20 and a metal suicide layer 22 is deposited and patterned, a second PMD layer 26 is deposited of a material similar to that of the first PMD layer on top of the first PMD layer covering the polycide line. The surface 28 of the second PMD layer 26 is not planar and therefore must be planarized before the next fabrication step can be carried out.

The second PMD layer 26 can be reflowed at a reflow temperature that is higher than the glass transition temperature of the PMD material of either BPSG or BPTEOS, i.e., a suitable reflow temperature is in the range between 750~850° C. After the reflow process, the top surface 30 of the second PMD layer 26 becomes substantially planar, however, at the expense of a deformed polycide line 18 which has moved away from its original position by the distance 32. This is shown in FIG. 1B.

The phenomenon of the deformation or movement of the polycide line 18 can be explained as follows. During the reflow process of the second PMD layer 26, the temperature of the device 10 must be raised to a temperature that is above the glass transition temperature of the dielectric material. Since the second PMD layer and the first PMD layer are usually deposited of a similar material, the reflow temperature required for the second PMD layer is also above the class transition temperature of the first PMD layer. As a consequence, both the first and the second PMD layers 16 and 26 soften and transform to a liquid state with the polycide line 18 suspended in the middle of two liquid layers. The polycide line 18 therefore deforms or drifts depending on the topography of the first PMD layer 16.

The deformation or drift of a polycide line after a reflow process can also be examined from FIGS. 2 and 3. FIG. 2 shows a polycide line 36 which has two polycide contacts 38 and 40. Prior to the reflow process, the polycide line 36 is in a straight line configuration as originally patterned in the fabrication step. After a reflow process is carried out at a temperature higher than the glass transition temperature of the two PMD layers between which the polycide line is sandwiched, the line bends drifts to the right at its middle point since there is no support by the underlaying first PMD layer. The polycide contacts 38 and 40 have not moved since they are anchored to polysilicon gate structures situated in the first PMD layer.

A similar deformation of another polycide line 46 is shown in FIG. 3. While the polycide contact 48 has not moved because it is anchored to a gate structure below, the polycide line 46 has drifted (or twisted) to the right since the lower part of the polycide line 46 is not anchored and therefore is free to move when the first and the second PMD layers transform into a liquid state during the reflow process. It should be noted that the deformation or drifting shown in FIGS. 2 and 3 are for illustration purpose only, and the true deformation or drifting depends on the topography of the PMD layer on which the polycide line is situated. The deformation or drifting of polycide lines presents a serious problem in the reliability of a semiconductor device since a polycide line may be drifted away from its original position and as a result, contacting other unintended via or interconnect and causing a short in the device. The deformation or drifting of a polycide line during a reflow process for the dielectric layers must therefore be controlled or avoided.

It is therefore an object of the present invention to provide a method for preventing a polycide line situated between two dielectric layers in a semiconductor device from deformation during a reflow process for the top dielectric layer.

It is another object of the present invention to provide a method for preventing a polycide line situated between two dielectric layers in a semiconductor device from deformation during a reflow process for the top dielectric layer that does not require significant modification of the fabrication process.

It is a further object of the present invention to provide a method for preventing a polycide line situated between two dielectric layers from deformation during a reflow process for the top dielectric layer that can be easily integrated into an existing fabrication process for the semiconductor device.

It is yet another object of the present invention to provide a method for preventing a polycide line situated between two dielectric layers from deformation during a reflow process for the top dielectric layer by hardening the polycide line through an annealing process such that the hardness of the line increases sufficiently to prevent deformation.

It is still another object of the present invention to provide a method for preventing a polycide line situated between two dielectric layers in a semiconductor device from deformation during a reflow process for the top dielectric layer by annealing the semiconductor device in a furnace at a sufficient temperature for a sufficient length of time such that the hardness of the line increases.

It is another further object of the present invention to provide a semiconductor structure that has at least one polycide line situated in between two dielectric layers that does not have the polycide line deformation problem during a reflow process for the top dielectric layer.

SUMMARY OF THE INVENTION

In accordance with the present invention, a method for preventing a polycide line situated in between two dielectric layers in a semiconductor device from deformation during a reflow process for the top dielectric layer is provided.

In a preferred embodiment, a method for preventing a polycide line situated between two poly-metal dielectric layers from deformation during a reflow process can be carried out by providing a silicon substrate and forming at least one active device in the substrate; depositing a first dielectric layer on the substrate, and then a polysilicon layer and a metal silicide layer sequentially in a juxtaposed relationship on the first dielectric layer; hardening the polysilicon and the metal silicide layers at an annealing temperature that is sufficiently high so as to cause the layers to harden; patterning and forming at least one polycide line from the polysilicon and the metal silicide layers for providing electrical communication to the at least one active device; and depositing and reflowing a second dielectric layer on the at least one polycide line and the first dielectric layer.

In an alternate embodiment, the at least one polycide line is first formed by a patterning and etching process in the polysilicon/metal silicide layers and then annealed at a sufficiently high temperature to increase the hardness of the polycide line. A suitable annealing temperature is in the range between about 700° C. and about 1000° C.

The present invention is also directed to a semiconductor structure which includes a semi-conducting substrate that has at least one active device formed therein; a first dielectric layer on the semi-conducting substrate; at least one polycide line formed on the first dielectric layer for providing electrical communication to the at least one active device; the at least one polycide line has improved hardness after being annealed at an annealing temperature of not less than 700° C.; and a second dielectric layer on the at least one polycide line and the first dielectric layer.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a novel method for preventing a polycide line situated between two dielectric layers in a semiconductor device from deformation during a reflow or planarization process for the dielectric layer. The method can be easily carried out without making significant changes in the fabrication processes. The method consists of the step of annealing the polycide line before the second dielectric layer is deposited at a temperature sufficiently high such that the hardness of the polycide line is increased. The method can be advantageously carried out with only minimal changes made in the present fabrication process, i.e., by the addition of an annealing step. The same masking, etching and forming steps for the semiconductor device can be practiced. The present invention novel method can also be used to harden a polycide bulk in a similar way as used for the polycide lines. Since polycide contacts are frequently designed and positioned along the edges of a polycide bulk, the polycide deformation problem can also effect the performance of a polycide bulk.

Figure 1A:
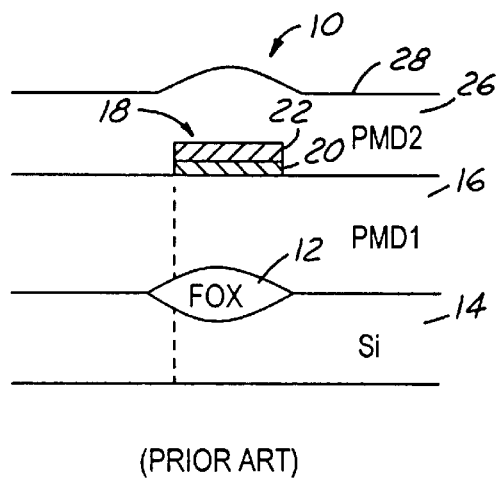
FIG. 1A is an enlarged, cross-sectional view of a conventional semiconductor structure that has a polycide line situated in between two dielectric layers.
Figure 2:
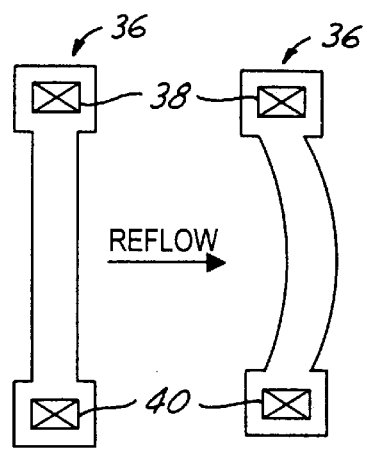
FIG. 2 is an illustration showing a polycide line having two polycide contacts before and after a reflow process.
Figure 1B:
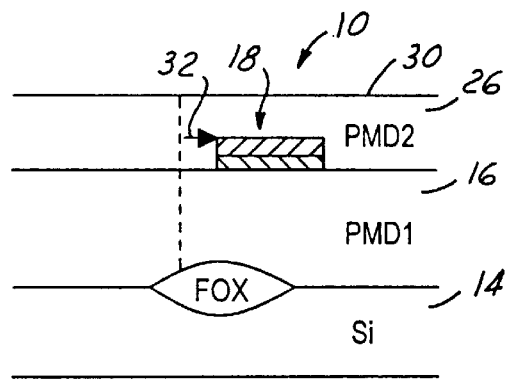
FIG. 1B is an enlarged, cross-sectional view of the conventional semiconductor structure shown in FIG. 1A after a reflow process on the second PMD layer is carried out.
Figure 3:
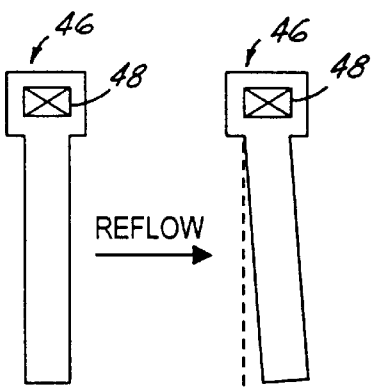
FIG. 3 is an illustration showing a polycide line having one polycide contact before and after a reflow process.
Figure 4A:
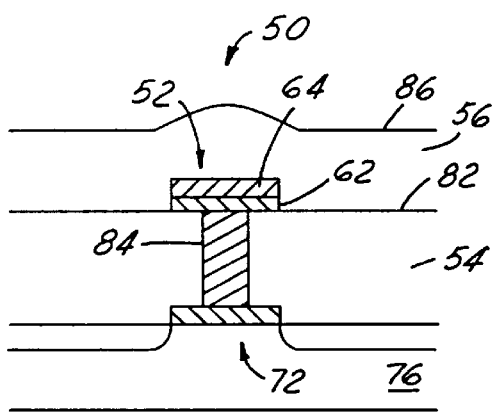
FIG. 4A is an enlarged, cross-sectional view of a present invention semiconductor device that has a polycide line situated in between two dielectric layers prior to a reflow process.

Referring now to FIG. 4A where a present invention semiconductor structure 50 having a polycide line 52 situated between a first dielectric layer 54 and a second dielectric layer 56 is shown. The polycide line is formed by the sequential deposition of a polysilicon layer 62 and a metal silicide layer 64. The metal silicide layer 64 can be formed of anyone of the metal silicide materials such as titanium silicide, cobalt silicide, tungsten silicide, platinum silicide, molybdenum silicide, palladium silicide, tantalum silicide, etc.

In the next processing step, a first dielectric layer 54 (a PMD layer or an ILD layer) is deposited by a chemical vapor deposition technique to substantially cover the silicon substrate 76 and the active device 72. The dielectric layer 54 is then planarized by a reflow process by subjecting the semiconductor structure 50 to a reflow temperature that is higher than the glass transition temperature of the dielectric material. For instance, when a dielectric material such as BPSG, BPTEOS, or PSG is used, a reflow temperature between about 700° C. and about 900° C. can be suitably used to cause the material to flow and to obtain a substantially planar top surface. A more preferred range of the reflow temperature is between about 750° C. and about 850°.

After the top surface 82 of the PMD layer 54 is planarized, an opening for contact 84 is etched. The contact may then be filled by depositing a polysilicon, a metal or any other suitable contact material. After an etch-back process for removing the excess contact material from surface 82 of the dielectric layer 54 is carried out, a polycide line 52 can be formed by the sequential deposition of a polysilicon layer and a metal suicide layer, and then masking and patterning for forming the polycide line 52. After the photoresist layer (not shown) is removed, a second dielectric layer 56 of a suitable material (such as that used in the first dielectric layer 54) can be deposited on top of the polycide line 52 and the first dielectric layer 54. A substantially non-planar surface 86 is formed. This is shown in FIG. 4A.

Figure 4B:
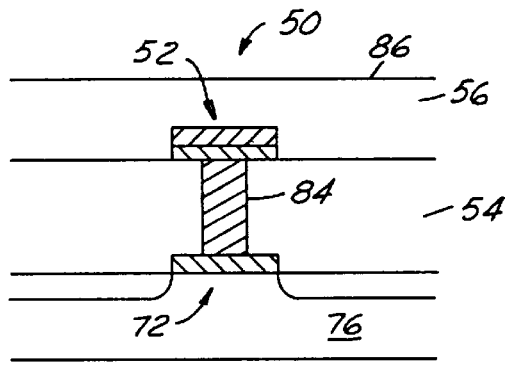
FIG. 4B is an enlarged, cross-sectional view of a present invention semiconductor device that has a polycide line situated in between two dielectric layers after a reflow process for the top dielectric layer is conducted showing no deformation in the polycide line.

The present invention advantageous result can be seen in FIG. 4B where an enlarged, cross-sectional view of the semiconductor structure 50 obtained after a reflow process for the second dielectric layer 56 is conducted is shown. It is seen that while the top surface 86 of the second dielectric layer 56 is substantially planarized, the polycide line 52 has not deformed or moved away from its original position held prior to the reflow process. The advantageous result is achieved because the polycide line 52 is first hardened prior to the deposition process being carried out for the second dielectric layer. The hardening process for the polycide line 52 can be carried out in two different ways.

In a preferred embodiment, after the first dielectric layer 54 is deposited and reflowed, layers of polysilicon and a metal silicide (not shown) are deposited on the top surface 82 of the first dielectric layer 54. The semiconductor structure 50 is then annealed in either a furnace or by a rapid thermal process (RTP). When the semiconductor structure 50 is annealed in a furnace, the temperature of the furnace can be controlled in a range between about 700° C. and about 950° C. The annealing time required for increasing the hardness of a polycide line that has not yet been formed is in the range between about 5 seconds and about 5000 seconds. A more preferred range for the annealing temperature is between about 750° C. and about 850° C. and a more preferred annealing time is between about 300 seconds and about 4000 seconds. After the annealing process is completed, the layers of polysilicon and metal silicide are patterned and formed into polycide lines. The increase in the hardness of the polycide line 52 (shown in FIG. 4A) is found to be higher than 10%. The semiconductor structure 50 can also be annealed in a RTP process which is frequently conducted at a higher temperature, i.e., up to about 1000° C. The annealing time required in a RTP is normally shorter than that required in a furnace. For instance, a preferred annealing time in a RTP is between about 5 seconds and 2000 seconds. The RTP process can be carried out in a shorter time period since hot air is used to more efficiently transfer heat to the semiconductor structure.

In an alternate embodiment, after the first dielectric layer 54 is deposited and reflowed, a polycide layer 52 consists of a polysilicon layer 62 and a metal silicide layer 64 is first deposited on the top surface 82 of the first dielectric layer 54, and then formed by conventional photo lithographic and etching methods into a polycide line 52. The polycide line 52 is then annealed by either a furnace or a RTP similar to that used in the preferred embodiment. The improvement in the hardness of the polycide line is comparable to that obtained in the preferred embodiment. It has been observed that usually at least a 10% improvement in the hardness can be obtained.

It should be noted that while it is not shown in FIGS. 4A and 4B, a layer of undoped silicate glass (USG) is frequently used as an additional layer deposited on top of the polycide line situated in between the two dielectric layers. The function of the USG layer is act as a barrier layer to prevent any possible dopant ion diffusion from the doped dielectrical layer. Since the USG layer does not flow at the normal reflow temperatures for the dielectric layers, the thickness of the USG layer should be controlled in order to minimize the step height increase in the device. A suitable thickness of the USG layer used is normally less than 2000 Å, and preferably less than 1000 Å.

While the present invention has been described in an illustrative manner, it should be understood that the terminology used is intended to be in a nature of words of description rather than of limitation.

Furthermore, while the present invention has been described in terms of a preferred and an alternate embodiment it is to be appreciated that those skilled in the art will readily apply these teachings to other possible variations of the inventions.

The embodiment of the invention in which an exclusive property or privilege is claimed are defined as follows:

1. A method for preventing a polycide line situated between two dielectric layers from deformation during a reflow process for one of the dielectric layers comprising the steps of:

providing a semiconducting substrate, forming at least one active device in said substrate, depositing a first dielectric layer on said substrate, forming a contact in said dielectric layer, depositing a polysilicon layer and a metal silicide layer sequentially in a juxtaposed relationship on said first dielectric layer forming a polycide layer, exposing said polycide layer to an annealing temperature sufficiently high so as to cause said polycide layer to harden, forming at least one polycide line from said polycide layer for connecting to said at least one active device, and depositing and reflowing a second dielectric layer on said at least one polycide line and said first dielectric layer.

2. A method according to claim 1 further comprising the step of planarizing said first dielectric layer prior to the deposition step for said polysilicon and said metal silicide layers.

3. A method according to claim 1, wherein said reflow process is conducted at a temperature not less than the glass transition temperature of said second dielectric layer.

4. A method according to claim 1, wherein said forming step of said at least one polycide line comprises photomasking and etching steps.

5. A method according to claim 1, wherein said metal silicide layer is selected from the group consisting of titanium silicide, cobalt silicide, tungsten silicide, platinum silicide, molybdenum silicide, palladium silicide and tantalum silicide.

6. A method according to claim 1, wherein said metal silicide layer is formed of a refractory metal suicide.

7. A method according to claim 1, wherein said first and said second dielectric layers are formed of a material selected from the group consisting of boro-phosphosilicate glass (BPSG), boro-phospho-tetra-ethoxy-silicate (BPTEOS) glass and phosphosilicate glass (PSG).

8. A method according to claim 1, wherein said first and said second dielectric layers are deposited by a chemical vapor deposition technique.

9. A method according to claim 1, further comprising the step of depositing a barrier layer on said at least one polycide line to prevent dopant ion diffusion from said second dielectric layer.

10. A method according to claim 1, wherein said polycide layer is hardened by an increase in its hardness by at least 10%.

11. A method according to claim 1, wherein said at least one polycide line is a polycide bulk.

12. A method for preventing a polycide line situated between two dielectric layers in a semiconductor device from deformation during a reflow process for one of the dielectric layers comprising the steps of:

providing a semiconducting substrate and forming at least one active device in said substrate, depositing a first dielectric layer on said at least one active device, forming at least one contact in said first dielectric layer for providing electrical communication to said at least one active device, forming at least one polycide line on said first dielectric layer for providing electrical communication to said at least one contact, exposing said at least one polycide line to an annealing temperature and for an annealing time sufficient to cause the hardness of said at least one polycide line to increase by not less than 10%, and depositing a second dielectric layer on said at least one polycide line and said first dielectric layer.

13. A method according to claim 12 further comprising the step of planarizing said first and said second dielectric layers by a reflow process.

14. A method according to claim 13, wherein said reflow process is conducted at a temperature not less than the glass transition temperature of said first and said second dielectric layers.

15. A method according to claim 12, wherein said semiconducting substrate is a silicon substrate.

16. A method according to claim 1, wherein said at least one polycide line is formed by first depositing a polysilicon layer and then depositing a metal silicide layer.

17. A method according to claim 16, wherein said metal silicide layer is selected from the group consisting of titanium silicide, cobalt silicide, tungsten silicide, platinum silicide, molybdenum silicide, palladium silicide and tantalum silicide.

18. A method according to claim 12, wherein said first and said second poly-metal dielectric layers are formed of a material selected from the group consisting of boro-phophosilicate glass (BPSG), boro-phospho-tetra-ethoxy-silicate (BPTEOS) glass and phosphosilicate glass (PSG).

19. A method according to claim 12, wherein said first and said second dielectric layers are deposited by a chemical vapor deposition technique.

20. A method according to claim 12, further comprising the step of depositing a barrier layer on said at lest one polycide line to stop dopant ion diffusion from said second dielectric layer.

21. A method according to claim 20, wherein said barrier layer is deposited of undoped silicate glass (USG).

22. A method according to claim 12, wherein said at least one polycide line is a polycide bulk.

* * * * *